(12) United States Patent
Yang et al.

(10) Patent No.: US 9,082,533 B2
(45) Date of Patent: Jul. 14, 2015

(54) MEMRISTIVE ELEMENT BASED ON HETERO-JUNCTION OXIDE

(75) Inventors: Jianhua Yang, Palo Alto, CA (US); Minxian Max Zhang, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/345,293

(22) PCT Filed: Oct. 21, 2011

(86) PCT No.: PCT/US2011/057230
§ 371 (c)(1),
(2), (4) Date: Mar. 17, 2014

(87) PCT Pub. No.: WO2013/058760
PCT Pub. Date: Apr. 25, 2013

(65) Prior Publication Data
US 2014/0311790 A1    Oct. 23, 2014

(51) Int. Cl.
*H05K 1/16* (2006.01)
*H05K 7/00* (2006.01)
(Continued)

(52) U.S. Cl.
CPC .............. *H01C 10/00* (2013.01); *G11C 13/003* (2013.01); *H01C 10/16* (2013.01);
(Continued)

(58) Field of Classification Search
CPC ... H01L 45/08; H01L 45/1233; H01L 45/146; H01L 27/2463; H01L 27/2481; H01L 45/04; H01L 45/144; H01L 27/24; H01L 224/16; H01L 2924/1026; H01L 2924/1067; H01C 10/00; H01C 10/16; H05K 1/18; H05K 2201/10053; G11C 13/003; G11C 2213/71; G11C 2213/15; G11C 2213/55; G11C 2213/56; H01H 1/403; H01H 1/5805; B82Y 20/00; B82Y 10/00; B82Y 33/32
USPC ........... 174/260–261; 361/781, 783; 257/1–4, 257/12; 338/13, 20
See application file for complete search history.

(56) References Cited

U.S. PATENT DOCUMENTS 7,666,526 B2    2/2010  Chen et al.
7,875,871 B2    1/2011  Kumar et al.
(Continued)

FOREIGN PATENT DOCUMENTS

KR    2010-0020844 A       8/2008
KR    10-20100061405        6/2010
(Continued)

OTHER PUBLICATIONS

International Search Report and Written Opinion, Korean IPO, May 23, 2012, Hewlett-Packard Development Company, L.P., PCT Application No. PCT/US2011/057230.
(Continued)

*Primary Examiner* — Hoa C Nguyen
(74) *Attorney, Agent, or Firm* — Hewlett-Packard Patent Department

(57) ABSTRACT

Memristive elements are provided that include an active region disposed between a first electrode and a second electrode. The active region includes an switching layer of a first metal oxide and a conductive layer of a second metal oxide, where a metal on of the first metal oxide differs from a metal ion of the second metal oxide. The memristive element exhibits a nonlinear current-voltage characteristic in the low resistance state based on the oxide hetero-junction between the first metal oxide and the second metal oxide. Multilayer structures that include the memristive elements also are provided.

22 Claims, 7 Drawing Sheets

(51) Int. Cl.
*H01L 47/00* (2006.01)
*H01L 29/06* (2006.01)
*H01C 10/00* (2006.01)
*H01L 45/00* (2006.01)
*H01L 27/24* (2006.01)
*H01C 10/16* (2006.01)
*H05K 1/18* (2006.01)
*G11C 13/00* (2006.01)

(52) U.S. Cl.
CPC ....... *H01L 27/2463* (2013.01); *H01L 27/2481* (2013.01); *H01L 45/08* (2013.01); *H01L 45/1233* (2013.01); *H01L 45/146* (2013.01); *H05K 1/18* (2013.01); *G11C 2213/15* (2013.01); *G11C 2213/55* (2013.01); *G11C 2213/56* (2013.01); *G11C 2213/71* (2013.01)

(56) References Cited

U.S. PATENT DOCUMENTS

| | | | |
|---|---|---|---|
| 2007/0117256 A1* | 5/2007 | Stewart et al. | 438/99 |
| 2007/0252128 A1* | 11/2007 | Williams et al. | 257/2 |
| 2007/0252193 A1 | 11/2007 | Cho et al. | |
| 2008/0079029 A1* | 4/2008 | Williams | 257/213 |
| 2010/0102289 A1 | 4/2010 | Dimitrov et al. | |
| 2010/0258782 A1* | 10/2010 | Kuse et al. | 257/4 |
| 2010/0264397 A1* | 10/2010 | Xia et al. | 257/4 |
| 2011/0017977 A1 | 1/2011 | Bratkovski et al. | |
| 2011/0024716 A1 | 2/2011 | Bratkovski et al. | |
| 2011/0233509 A1* | 9/2011 | Shigeoka et al. | 257/4 |
| 2011/0240951 A1* | 10/2011 | Yang et al. | 257/5 |
| 2012/0248396 A1* | 10/2012 | Ramaswamy et al. | 257/4 |
| 2013/0010530 A1* | 1/2013 | Katayama et al. | 365/148 |
| 2013/0175497 A1* | 7/2013 | Yang et al. | 257/5 |

FOREIGN PATENT DOCUMENTS

| | | |
|---|---|---|
| WO | WO-2010085225 | 7/2010 |
| WO | WO-2010117355 A1 | 10/2010 |
| WO | WO-2010151844 | 12/2010 |
| WO | WO-2011028208 A1 | 3/2011 |
| WO | WO-2011028210 | 3/2011 |

OTHER PUBLICATIONS

Dong, C.Y., et al. Roles of Silver Oxide in the Bipolar Resistance Switching Devices with Silver Electrode, Feb. 17, 2011, Applied Physics Letters 98, 3 pages.

Supplementary European Search Report, Mar. 18, 2015, European Patent Application No. 11874307.9, 5 pages.

Zhou, H., et al., Flexible Resistive Switching Memory Based on Mn0.20Zn0.80 O/HfO2 Bilayer Structure, Oct. 18, 2011, Journal of Physics D: Applied Physics 44, 5 pages.

* cited by examiner

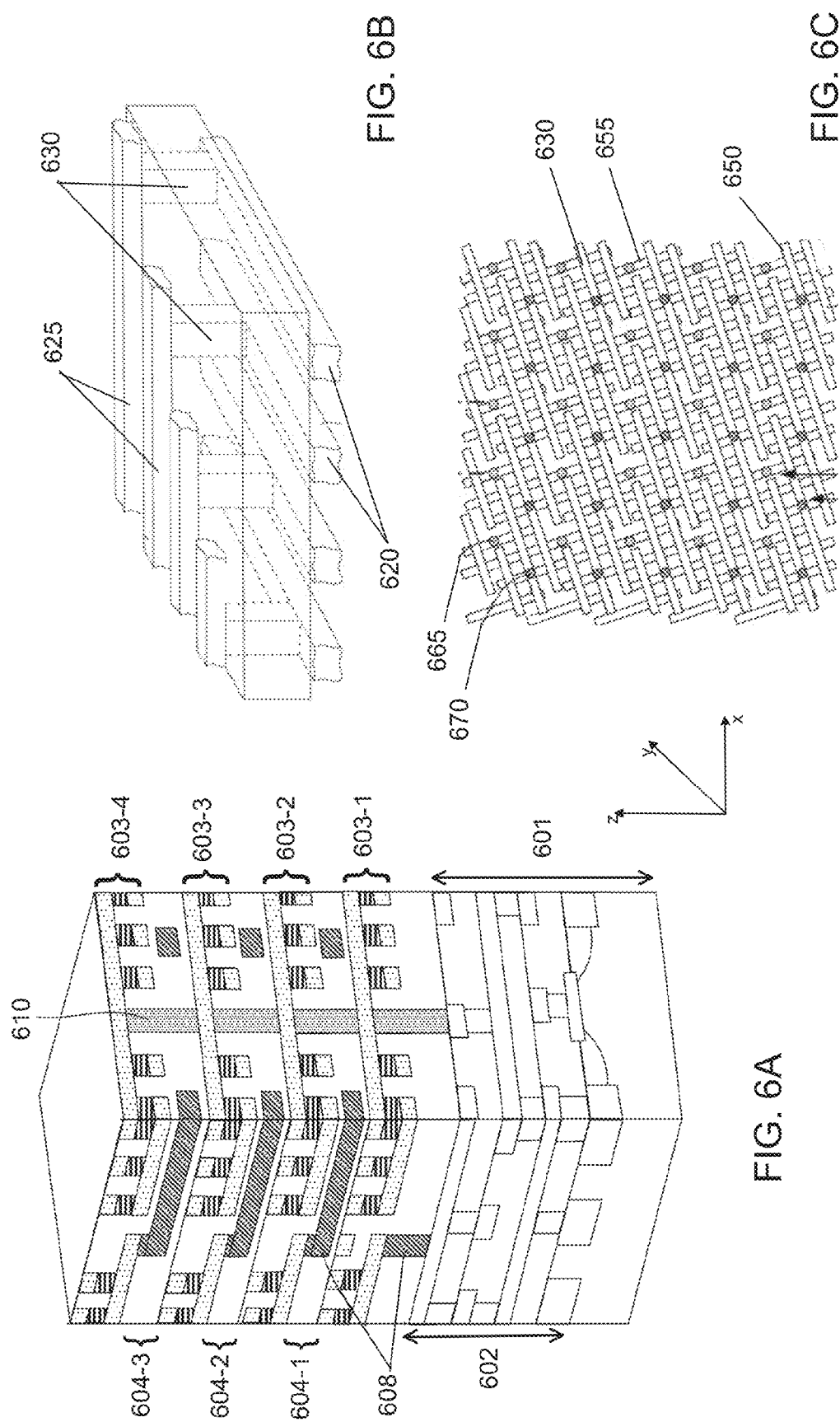

MEMRISTIVE ELEMENT BASED ON HETERO-JUNCTION OXIDE

STATEMENT REGARDING FEDERALLY SPONSORED RESEARCH OR DEVELOPMENT

This invention has been made with government support awarded by Defense Advanced Research Prefects Agency. The government has certain rights in the invention.

BACKGROUND

Memory that is not necessarily based on silicon, including resistance random access memory, is showing great promise as an emerging technology. The memory can be based on two-dimensional circuits, or three-dimensional (3D) circuits that include stacked, multiple layers of interconnected two-dimensional arrays (2D) of memristive elements. Such circuitry can provide potential solutions for increasing the performance and planar density of integrated circuits.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 6A illustrates another example multilayer structure that includes an array of memristive elements.

FIG. 6B illustrates a perspective view of the example multilayer structure of FIG. 6A.

FIG. 6C illustrates a top view of the example multilayer structure of FIG. 6A.

Throughout the drawings, identical reference numbers designate similar, but not necessarily identical, elements.

DETAILED DESCRIPTION

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment or example, but not necessarily in other embodiments or examples. The various instances of the phrases "in one embodiment," "in one example," or similar phrases in various places in the specification are not necessarily all referring to the same embodiment or example.

As used herein, the term "includes" means includes but not limited to, the term "including" means including but not limited to. The term "based on" means based at least in part on.

Described herein are memristive elements having electronic properties that facilitate targeted application of read and write operations to an individual memristive element in a 2D or 3D circuit, with minimal sneak current through neighboring memristive elements. The memristive elements described herein exhibit a nonlinear current-voltage characteristic in the low resistance state based an oxide heterojunction of the memristive elements. Also described are multilayer structures, which are 3D circuits that include stacked, multiple layers of interconnected 2D arrays of the memristive elements.

The memristive elements provided herein possess current-voltage properties that facilitate targeted application of potentials (i.e., a read voltage or a write voltage) to individual memristive elements in a multilayer structure with minimal sneak current through neighboring memristive elements (i.e., the half-selected devices). That is, the current-voltage properties of the memristive elements provided herein are such that a potential can be applied to a given memristive element in the 2D or 3D circuit with little activation of neighboring memristive elements in the multilayer structure.

The memristive elements and multilayer structures described herein are applicable to any medium capable storing information. In an example, the information stored on the medium is readable by a machine, including a computer. Non-limiting examples of such a medium include forms of non-volatile computer-readable memory, including, for example, semiconductor memory devices, such as a dynamic random access memory, a resistance random access memory, a flash memory, a read-only memory, and a static random access memory.

Figure 1A:
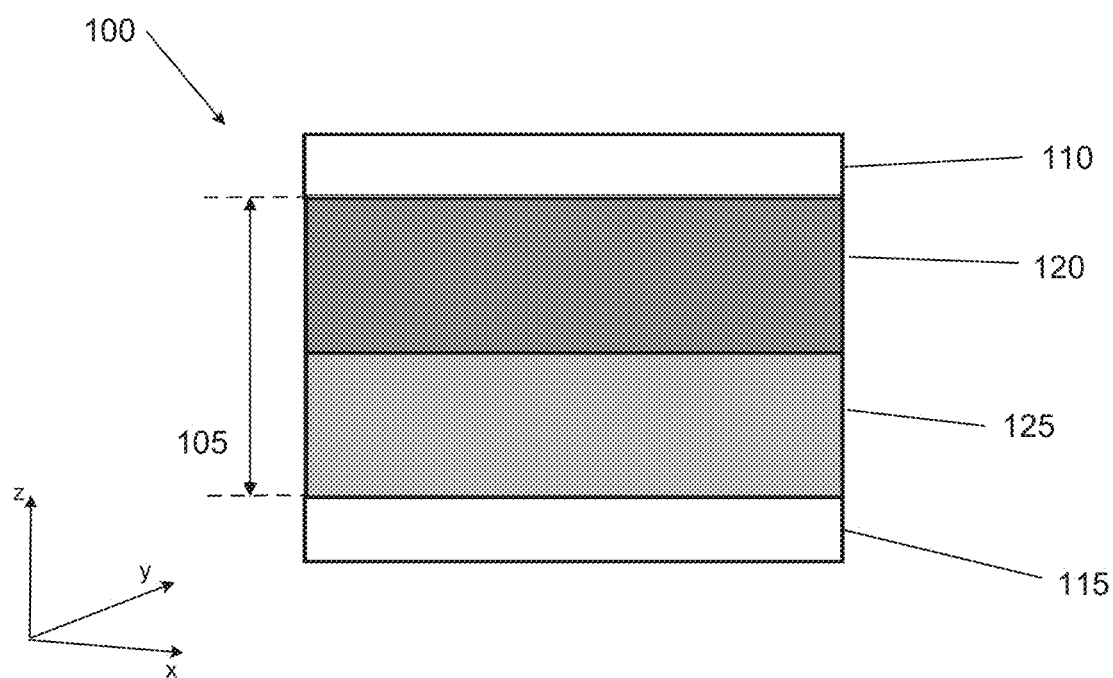
FIGS. 1A and 1B illustrate cross-sections of example of memristive elements.

FIG. 1A shows an example memristive element 100 according to a principle described herein. The memristive element 100 includes an active region 105 disposed between a first electrode 110 and a second electrode 115. The active region 105 including a switching layer 120 and a conductive layer 125 formed of a dopant source material. The switching layer 120 is formed of a switching material capable of carrying a species of dopants and transporting the dopants under an applied potential. The conductive layer 125 is disposed between and in electrical contact with the switching layer 120. Conductive layer 125 is formed of a dopant source material that includes the species of dopants that are capable of drifting into the switching layer under the applied potential and thus changing the conductance of memristive element 100. When a potential is applied to memristive element 100 in a first direction, the switching layer develops an excess of the dopants. When the direction of the potential is reversed, the voltage potential polarity is reversed, and the drift direction of the dopants is reversed. The switching layer develops a deficiency of dopants.

Figure 1B:
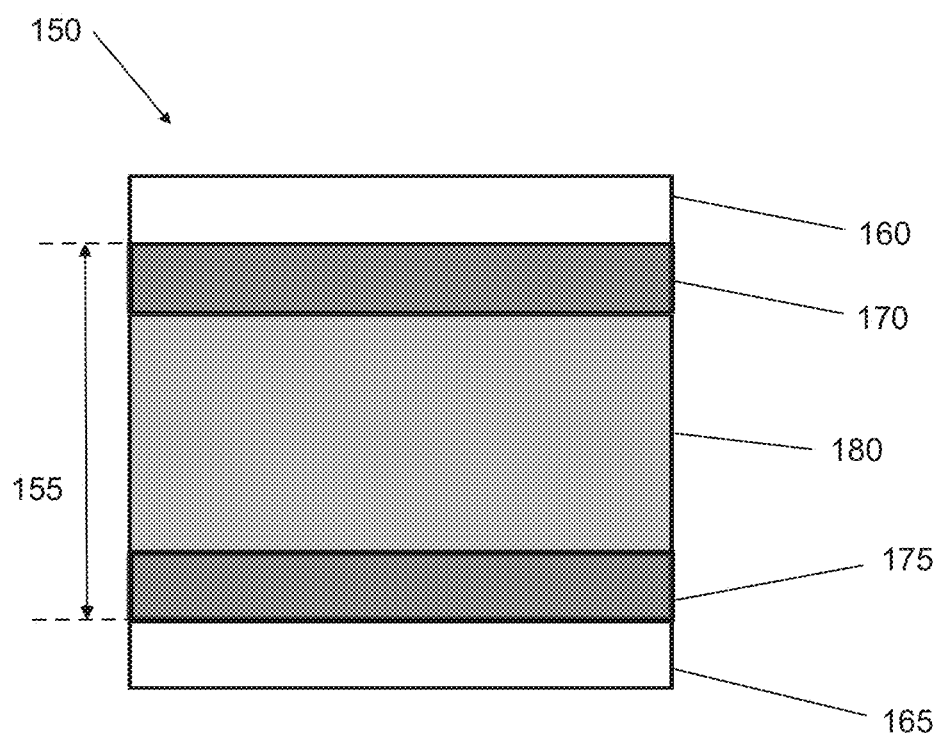

FIG. 1B shows another example memristive element 150 according to principles described herein. The memristive element 150 includes an active region 155 disposed between first electrode 160 and second electrode 165. The active region 155 including two switching layers 170, 175 and a conductive layer 180 formed of a dopant source material. The switching layers 170, 175 are each formed of a switching material capable of carrying a species of dopants and transporting the dopants under an applied potential. The conductive layer 180 is disposed between and in electrical contact with the switching layers 170, 175. Conductive layer 180 is formed of a dopant source material that includes the species of dopants that are capable of drifting into the switching layers under the applied potential and thus changing the conductance of memristive element 150. When a potential is applied to memristive element 150 in a first direction (such as in the positive z-axis direction), one of the switching layers develops an excess of the dopants and the other switching layer develops a deficiency of the dopants. When the direction of the potential is reversed the voltage potential polarity is reversed, and the drift direction of the dopants is reversed. The first switching layer develops a deficiency of dopants and the other switching layer develops an excess of dopants.

The switching layer and the conductive layer each are formed of a metal oxide. The metal oxide of either layer can be an oxide of Al, Si, Ga, Ge, Sr, Ba, Sc, Ti, V, Cr, Mn, Fe, Co, Ni, Cu, Zn, Y, Zr, Nb, Mo, Ru, Rh, Pd, Ag, Cd, La, Hf, Ta, W, Re, Os, Ir, or Pt, or some combination thereof. The metal oxides of the switching layer and the conductive layer differ by at least one metal ion. That is, a metal ion of the metal oxide of the switching layer differs from a metal ion of the metal oxide of the conductive layer. As an example, if the switching layer includes an oxide of metal A, then the conductive layer includes an oxide of metal B, where metal A is not the same as metal B. Another example is where the switching layer includes an oxide of metals A and C, and the conductive layer includes an oxide of metals C and D, where metal D is not the same as metal A. The memristive element includes a hetero-junction between the switching layer and the conductive layer due to the dissimilarity in the metal ions between the switching layer and the conductive layer. The memristive elements herein exhibit a nonlinear current-voltage characteristic in the low resistance state based on the oxide hetero-junction between the metal oxide of the switching layer and the metal oxide of the conductive layer.

The thickness of the switching layer in some examples can be about 10 nm or less, about 6 nm or less, about 4 nm or less, about 2 nm or less, or less than 1 nm. For example, the thickness of the switching layer can be about 5 nm or less. The conductive layer can be about the same thickness as the switching layer, or can be thicker than the switching layer. For example, the thickness of the conductive layer may range from 2 nm to 200 nm. Either of the electrodes can be made of platinum between about 7 nm and about 100 nm thick, or thicker. In another example, the electrode can be a copper/tantalum nitride/platinum system, where the copper is a very good conductor, and the tantalum nitride acts as a diffusion barrier between the copper and the platinum.

Typically, the switching material is an electronically insulating, semiconducting, or a weak ionic conductor. For example, the switching material can be a highly insulating stoichiometric compound. Examples of the switching material include a carbonate of silicon (including $SiCO_4$), an oxide of aluminum, an oxide of titanium (including $TiO_2$), an oxide of silicon (including $SiO_2$), an oxide of gallium, an oxide of germanium, and an oxide of a transition metal (including oxides of Sc, Ti, V, Cr, Mn, Fe, Co, Ni, Cu, Zn, Y, Zr, Nb, Mo, Hf, Ta, W, or Re). In non-limiting examples, the switching material is $TiO_2$, $TaO_x$, where $0<x\leq2.5$, or NiO.

The dopant source material is the source of the doping species for the switching material, and includes a relatively high concentration of dopants of the type that can be transported by the switching material. However, the dopant source material differs from the switching material by at least one metal ion. That is, the metal oxides of the switching layer and the conductive layer differ by at least one metal ion. The result is formation of a hetero-junction between the switching layer and the conductive layer. Examples of dopant source material include $IrO_2$, $MoO_2$, $OsO_2$, $RhO_2$, $Ti_2O_3$, $Ti_3O_5$, $Ti_4O_7$, $TiO_{2-x}$ ($0<x<1$), a ternary system (e.g., $SrTiO_{1-y}$ ($0<y\leq0.2$)), or a quaternary system. In non-limiting examples, the dopant source material is $RuO_2$, $WO_z$, where $0<z\leq3$, $SiO_x$, where $0<x<2$, or $HfO_x$, where $0<x<2$. The type of dopant depends on the type of dopant source material and switching material used. For example, where the dopant source material is $Ti_4O_7$, the dopant is oxygen vacancies.

In a non-limiting example, the switching material is an oxide of tantalum, including $TaO_x$, where $0<x\leq2.5$, and the dopant source material is an oxide of titanium, including $Ti_nO_{2n-1}$, where $n=2, 3, 4, 5, \ldots, 20$.

In another non-limiting example, the switching material is an oxide of tantalum, including $TaO_x$, where $0<x\leq2.5$, and the dopant source material is an oxide of tungsten, including $WO_{3-y}$, where $0\leq y\leq1$.

In the oxide hetero-junctions of the memristive elements described herein, the interface between the switching layer oxide and the conductive layer oxide provides great nonlinearity in the current-voltage relation. This nonlinearity may be caused by thermally-activated negative differential effect at the Schottky-like interfaces or some new phases with metal-insulator-transition formed at that interface.

Figure 2:
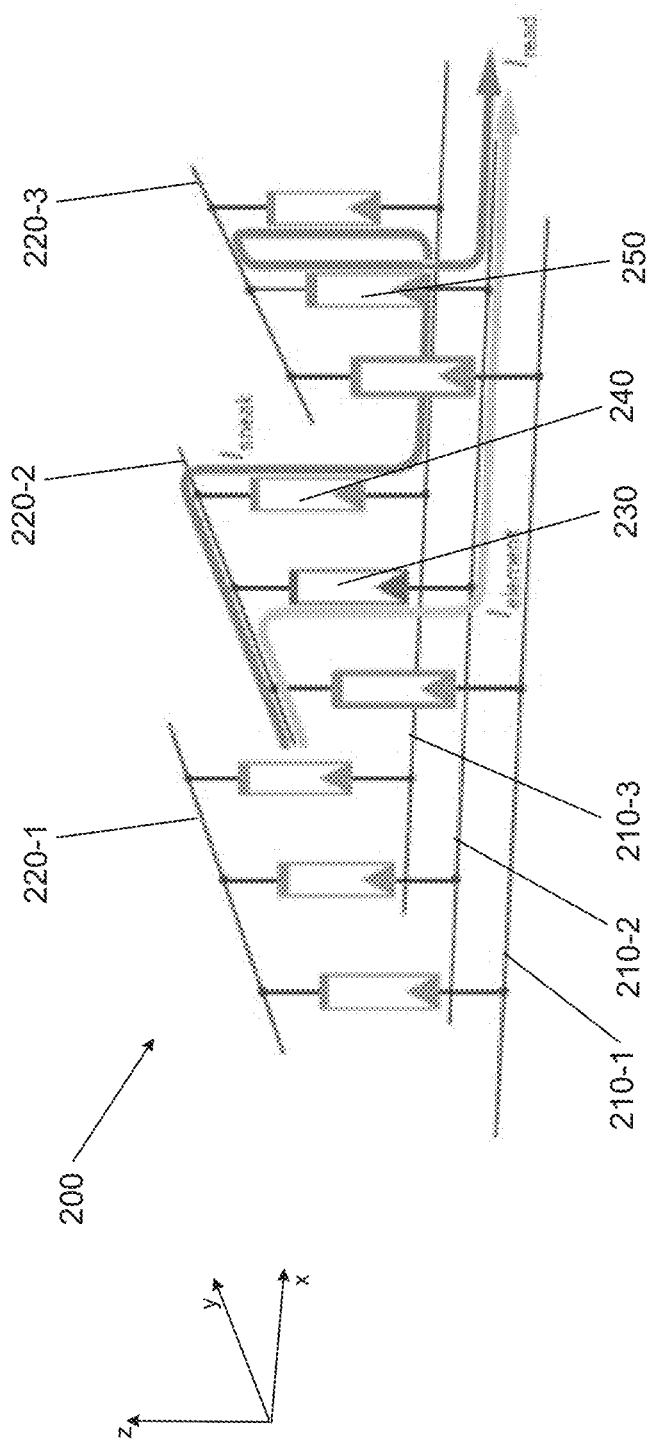
FIG. 2 illustrates an example arrangement of memristive elements.

FIG. 2 illustrates an example two-dimensional arrangement (x-y plane) of memristive elements 100. The memristive element can have the layer structure of the example illustrated in FIG. 1A or 1B. The memristive elements 200 can be a portion of a multilayer structure, such as a 2D circuit, or a 3D circuit with additional layers of the 2-D arrangement stacked in the z-direction. Each memristive element in the multilayer structure is disposed at an intersection of two sets of conductive lines 210, 220. The example of FIG. 2 illustrates three of each set of conductive lines 210-*i*, 220-*i* (i=1, 2, 3, . . . ). To operate memristive element 230, including to switch memristive element 230 or read the state of memristive element 230, a potential is applied across conductive lines 210-2 and 220-2. A voltage of sufficient magnitude to switch a memristive element is referred to as a "write" voltage. For example, to apply a total of 1.0V across memristive element 230, 0.5V is applied to conductive line 210-2 and −0.5V is applied to conductive line 220-2. Since other memristive elements also make electronic contact with conductive line 210-2 or conductive line 220-2, these neighboring memristive elements also see a voltage of magnitude 0.5V. For example, neighboring memristive elements 240 and 250 are each subjected to 0.5V. These neighboring memristive elements are referred to as half-selected devices.

There is a risk that the half-selected devices are switched at the potential applied to them, which is an undesirable result since it affects the stability of the multilayer structure in operation. As depicted in FIG. 2, the 1.0V applied across target memristive element 230 causes a current of magnitude $I_{element}$ to flow through target memristive element 230. The −0.5V applied across half-selected memristive element 240 causes a current of magnitude $I_{sneak}$ to flow through memristive element 240. The current of the half-selected devices $I_{sneak}$ is referred to as the sneak path current. As depicted in FIG. 2, the total read current ($I_{read}$) includes $I_{element}$ and $I_{sneak}$. The total sneak current (total $I_{sneak}$) through all the neighboring half-selected devices, when taken together, may be higher than the current though the target memristive element ($I_{element}$).

The size of a multilayer structure that includes memristive elements can be significantly limited due to the sneak path currents. For example, the sneak path currents in a large size array may be so high that not enough current flows though the selected memristive element to switch it. An attempt to increase the total input current level to the multilayer structure increases the heat generation and the power consumption of the structure. Also, the total input current level is limited by any transistor technology used in the driving circuit. In addition, the undesirable sneak path current may disable reading operation due to large noise levels. The ON (or "1") state of the multilayer structure is relevant since most of the sneak path currents run though those memristive elements in the ON state due to their lower resistance. Thus, it would be beneficial to have minimal sneak path current through the half-selected device. The memristive elements provided herein exhibit minimal sneak path current when they are half-selected devices. The memristive elements provided herein also exhibit reduced tendency of being switched at the half potentials applied to them as half-selected devices.

Figure 3:
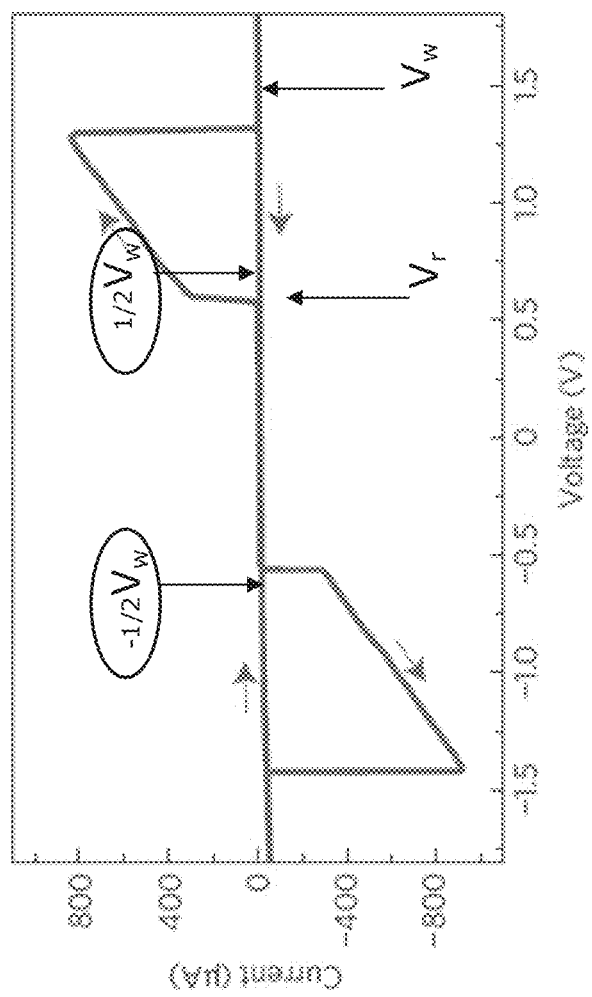
FIG. 3 illustrates an example current-voltage curve.

Memristive devices with linear current-voltage relation exhibit high sneak path currents when they are half-selected. An example of a device that normally exhibits a linear current-voltage relation in the low resistance state is one formed from a metal-doped oxide switching material with conductive oxide electrodes. In such a device, the switching occurs when electrons are trapped (OFF state) and detrapped (ON) in the switching oxide materials. A possible approach to preventing sneak path current in a device with a linear current-voltage relation is to position a pair of such devices in series with a head-to-head configuration, where the device pair is used as a single device at each crosspoint in a crossbar array. FIG. 3 shows a current-voltage (I-V) curve for such a device pair. This example device pair is switched at a write voltage ($V_W$) of about 1.5V to encode information on the device, and is read at a read voltage ($V_r$) of about 0.6V to probe the encoded state of the device. The write voltage switched the memristive element between two different resistance states, which can be deemed a "0" (or OFF) state and a "1" (or ON) state. The value of $V_w$ applied to switch (i.e., write to) the target memristive element to the OFF state may also have the undesired effect of switching the neighboring half-selected devices if they happen to be in the ON state (i.e., the voltage $\frac{1}{2}V_w$ may be high enough to switch the half-selected devices). Also, the value of the read voltage ($V_r$) applied to probe the state of the target memristive element in a read operation may destructively write the target memristive element, i.e., may switch the device state during reading. This can significantly increase the complexity of the reading operation for this type of device.

Another possible approach to preventing sneak path current in devices with a linear current-voltage relation is to use selective elements, such as transistors, with these memristive devices. However, introducing these selective elements within an arrangement of the memristive elements increases the complexity and expense of fabricating an arrangement of memristive elements, and limits scaling of any multilayer structure.

The memristive elements according to the principles herein exhibit nonlinear current-voltage (I-V) characteristics based on the hetero-junction formed between the switching layer and the conductive layer. The memristive elements according to the principles herein exhibit sufficient nonlinearity in both the ON ("1") and OFF ("0") states such that there is significantly reduced sneak path current through the half-selected devices. Accordingly, the multilayer structures that include the memristive elements exhibit nonlinear device current-voltage (I-V) relations, including in the low resistance stare (which is a desirable property).

Figure 4A:
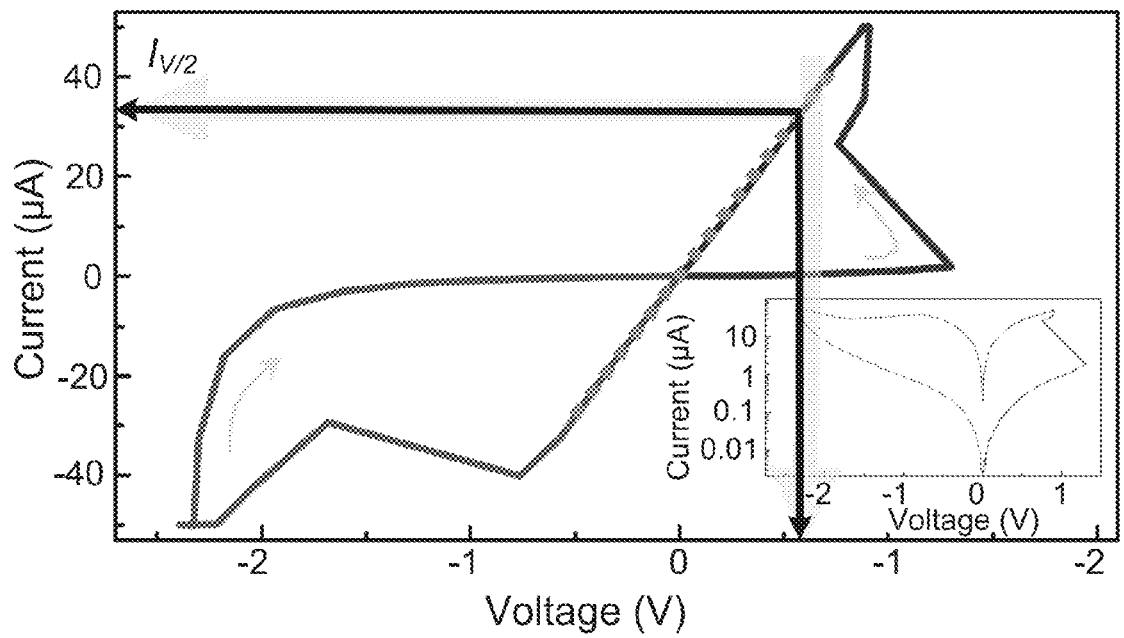
FIG. 4A shows current-voltage curves for an example device having linear current-voltage characteristics.
Figure 4B:
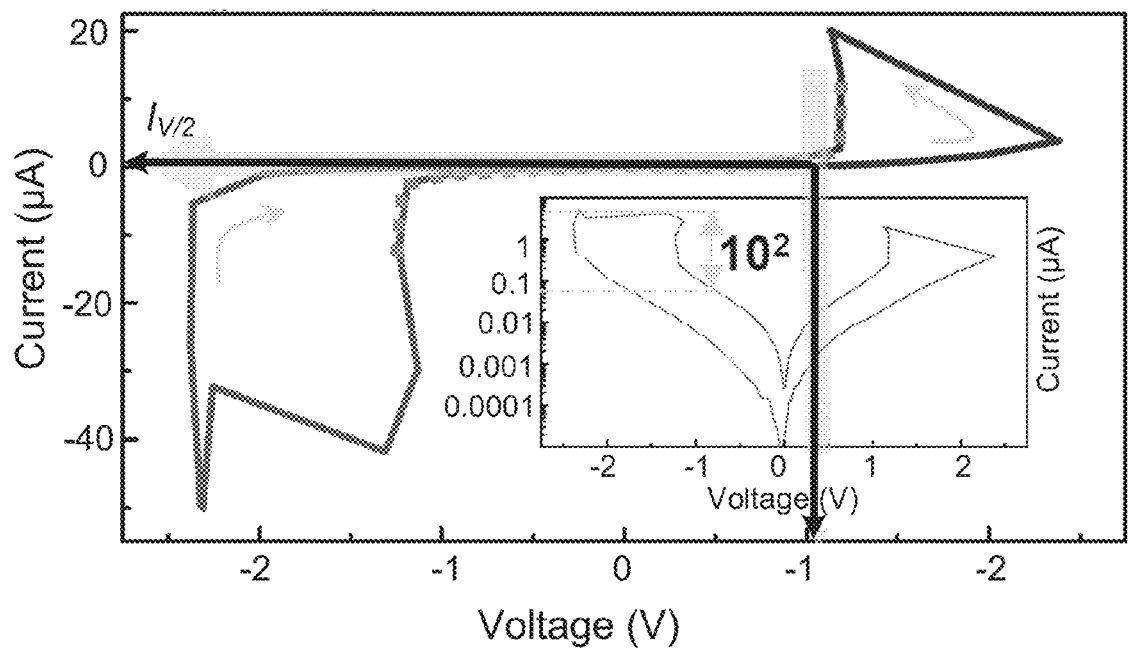
FIG. 4B shows current-voltage curves for an example device including memristive elements with nonlinear current-voltage characteristics.

FIG. 4A shows a current-voltage (I-V) characteristic curve of a 50 nm×50 nm nanodevice based on a Pt/TaO$_x$/Ta structure (where Pt and Ta are the electrodes). FIG. 4B shows a current-voltage (I-V) characteristic curve of an example device according to principles described herein. The nanodevice of FIG. 4B is a 50 nm×50 nm nanodevice based on a Pt/TaO$_x$/Ti$_4$O$_7$/Pt structure (where both electrodes are Pt). For both FIGS. 4A and 4B, the Current axis of the I-V curve is plotted on a linear scale in the larger graph, and on a logarithmic scale in the inset graph. The device of FIG. 4A exhibits a linear I-V response, with a sneak path current at half voltage value ($I_{v/2}$) of tens of µA. By comparison, the memristive element of FIG. 4B exhibits a nonlinear I-V response, with a much smaller sneak path current ($I_{v/2}$ less than 1 µA). Therefore, a memristive element according to principles described herein exhibits great nonlinearity, which makes it is highly desirable for implementation in a multilayer structure. Since the sneak path current is significantly reduced, no selective element, such as a transistor, is needed. As a result, the complexity and expense of fabricating an arrangement of these memristive elements into larger, more complex multilayer structures is reduced. The memristive elements are highly scalable and stackable. Since the sneak path currents are limited, the size of array of the memristive elements can be large. The memristive elements can be scaled down to scales below 10 nm and can be arranged in a 2D structure, or stacked in multilayer structures (including 3D structures).

Figure 5:
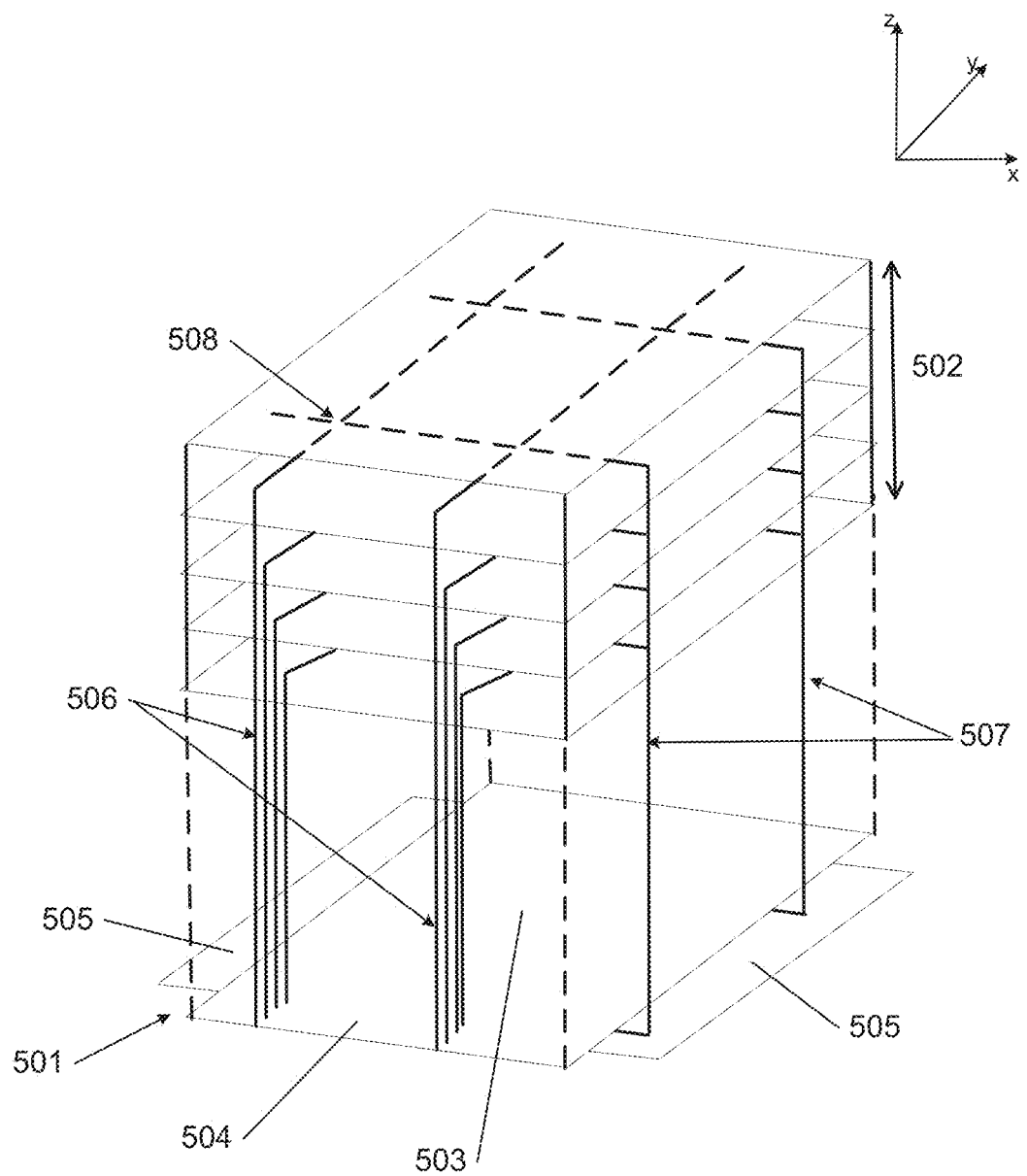
FIG. 5 illustrates an example multilayer structure that includes an array of memristive elements.

Multilayer structures including the memristive elements also are provided. FIG. 5 illustrates an example of a multilayer structure (such as but not limited to a memory circuit) to which the principles described herein are applicable. The multilayer structure is comprised of interconnected memristive elements arranged in a 3D architecture. The multilayer structure is configured as a base on which a memory circuit 502 is laminated, with conductive lines 506, 507 leading from the base to each layer of the multilayer structure. The example of FIG. 5 shows a multilayer structure having edge-disposed conductive lines 506 and 507. Memristive elements 508 are positioned in each 2D array on each layer at the intersection of conductive lines 506 and 507. Conductive lines 506, 507 provide electrical connectivity between the memristive elements and the base. The base includes a semiconductor substrate 501, a wiring area 503 (such as formed from CMOS circuitry), and contact areas 504 and 505 for the conductive lines. Conductive lines 506 and 507 connect each layer of interconnected memory cells to the wiring area 503 formed on the semiconductor substrate 501. Contact areas 504 and 505 are provided along four edges of the wiring area 503. The memory circuit 502 is illustrated as having four layers of 2D arrays of the interconnected memristive elements. However, the memory circuit can include more or fewer than four layers of 2D arrays. The wiring area 503 is provided in the semiconductor substrate 501 below the memory circuit 502. In the wiring area 503, a global bus or the like is used for providing instructions for writing (i.e., putting memristive elements to ON or OFF states) or reading from the circuit 502 with outside sources. That is, the external voltage is applied to memristive element(s) using conductive lines 506 and 507. In some examples, wiring area 503 includes a column control circuit including a column switch and/or a row control circuit including a row decoder. The base can be integrated with complementary metal-oxide-semiconductor (CMOS) or other conventional computer circuitry. The CMOS circuitry can be configured to selectively address, including applying the potential, to the targeted memristive element(s). For example, the CMOS circuitry can be used to apply the read and write voltages to the conductive lines as described above. This CMOS circuitry can provide additional functionality to the multilayer structure such as input/output functions, buffering, logic, or other functionality.

FIG. 5 shows one multilayer structure obtained by laminating a plurality of interconnected memory cells in a direction perpendicular to the semiconductor substrate 501 (z direction shown in FIG. 5). However, an actual structure can include a plurality of multilayer structures arranged in a matrix form in the longitudinal x-direction and/or in the longitudinal y-direction (shown in FIG. 5).

In the example of FIG. 5, conductive lines 506 can be driven independently using the external applied voltage in each layer and conductive lines 507 in all layers are illustrated as connected in common. However, it is also contemplated that conductive lines 507 may be driven independently in each layer using the external applied voltage. Alternatively, conductive lines 506 may be connected in common and conductive lines 507 may be driven independently using the external applied voltage. Further, at least one of conductive lines 506 and conductive lines 507 may be shared by upper and lower layers of the multilayer structure. The CMOS circuitry can be configured to selectively address (including applying external voltages to) ones of the memristive elements (the targeted memristive elements) using the conductive lines 506, 507.

An example multilayer structure according to the principles of FIG. 5 includes a base and a multilayer circuit disposed above the base. The multilayer circuit includes a plurality of the memristive elements depicted in FIG. 3A and/or FIG. 3B. Conductive lines lead from the base to the plurality of memristive elements. Each memristive element is disposed at an intersection of the conductive lines. In an example, the base includes CMOS circuitry that is used to apply a voltage to a target memristive element for a read operation or a write operation. The current through the target memristive element at the applied voltage is greater than the current though a neighboring half-selected memristive element by a factor of more than two.

FIG. 6A illustrate another example of a multilayer structure to which the principles described herein are applicable. The multilayer structure 600 includes a base 601 and a multilayer circuit disposed above the base. The base includes a CMOS layer 602. The multilayer circuit includes layers of interconnected memristive elements, each layer being formed as a 2D crossbar array 603-$i$ (i=1, . . . , 4). FIG. 6B illustrates a portion of a 2D crossbar array composed of a lower layer of approximately parallel nanowires 620 that are overlain by an upper layer of approximately parallel nanowires 625. The nanowires of the upper layer 625 are roughly perpendicular, in orientation, to the nanowires of the lower layer 620, although the orientation angle between the layers may vary. The two layers of nanowires form a lattice, or crossbar, in which each nanowire of the upper layer 625 overlies all of the nanowires of the lower layer 620. In this example, the memristive elements 630 are formed between the crossing nanowires at these intersections. Consequently, each nanowire 625 in the upper layer is connected to every nanowire 620 in the lower layer through a memristive element and vice versa. FIG. 6C illustrates a top view of the crossbar array, showing a set of upper crossbar wires (650), a set of lower crossbar wires (655), and a number of programmable memristive elements (660) interposed at the intersection between the upper crossbar wires (650) and the lower crossbar wires (655).

Different types of conductive lines form the conductive path that leads from the base to the memristive elements of the crossbar arrays of the example multilayer structure of FIG. 6A. One type of conductive line is wiring layers 604-$i$ (i=1, . . . , 3) that are interposed between successive crossbar arrays 603-$i$ (see FIG. 6A). Another type of conductive line that form the conductive path that connects the crossbar array to the base is two groups of vias 608, 610 (see FIG. 6A). A first group of vias 608 connects to the lower crossbar lines (nanowires 620) and a second group of vias 610 connects to the upper crossbar lines (nanowires 625). The second vias 610 pass through all the crossbar arrays 603-$i$ and wiring layers 604-$i$ as a vertical column. In contrast, the locations of the first vias 608 are shifted in each successive wiring layer 604-$i$. FIG. 6C also shows a top view of the first vias 665 and second vias 670 in the 2D crossbar array. Portions of the nanowires 620, 625 between the memristive elements also serve as conductive lines. The use of the conductive lines, including the wiring layers 604-$i$, first vias 608, second vias 610, lower crossbar lines (nanowires 620) and upper crossbar lines (nanowires 625), to uniquely address (including applying voltages to read data and/or to write data (i.e., set to an ON or OFF state)) to the memristive elements in the multilayer structure of FIGS. 6A-C are also described in international application no. PCT/US2009/039666, filed Apr. 6, 2009, titled "Three-Dimensional Multilayer Circuit," which is incorporated herein by reference in its entirety. The CMOS circuitry can be configured to selectively address (including applying external voltages to) ones of the memristive elements using the conductive lines (including the wiring layers 604-$i$, first vias 608, second vias 610, lower crossbar lines (nanowires 620) and upper crossbar lines (nanowires 625)).

The three dimensional multilayer structures described above could be used in a variety of applications. For example, the multilayer structures could be used as a very high density memory which replaces Dynamic Random Access Memory for computing applications; incorporated into a high density portable storage device that replaces flash memory and other removable storage devices for cell phones, cameras, net book and other portable applications; a very high density storage medium to replace magnetic hard disks and other forms of permanent or semi-permanent storage of digital data; and/or a very high density cache or other memory integrated on top of a computer processor chip to replace Static Random Access Memory. For example, the memristive elements described herein can be used in applications using different types of memory. Non-limiting examples of memory include semiconductor memory devices, such as a dynamic random access memory, a resistance random access memory, a flash memory, a read-only memory, and a static random access memory. The read/write operations may not be the same for the different types of memories, but in general, e.g., read involves sensing either the charge of a particular memristive element or passing current through the memristive element.

An example multilayer structure according to the principles of FIGS. 6A, 6B and 6C includes a base and a multilayer circuit disposed above the base. The multilayer circuit includes a plurality of the memristive elements of FIG. 3A and/or FIG. 3B. Conductive lines lead from the base to the plurality of memristive elements. Each memristive element is disposed at an intersection of the conductive lines. In an example, the multilayer structure includes a via array and crossbar arrays configured to overlie the base, where the crossbar arrays form a plurality of intersections, where the memristive elements are each positioned at different intersections, and where the conductive lines leading from the base to each of the memristive element include at least one via, and at least two crossbar lines of the crossbar arrays. In an example, the base includes CMOS circuitry that is used to apply a voltage to a target memristive element for a read operation or a write operation. The current through the target memristive element at the applied voltage is greater than the current though a neighboring half-selected memristive element by a factor of more than two.

Figure 7A:
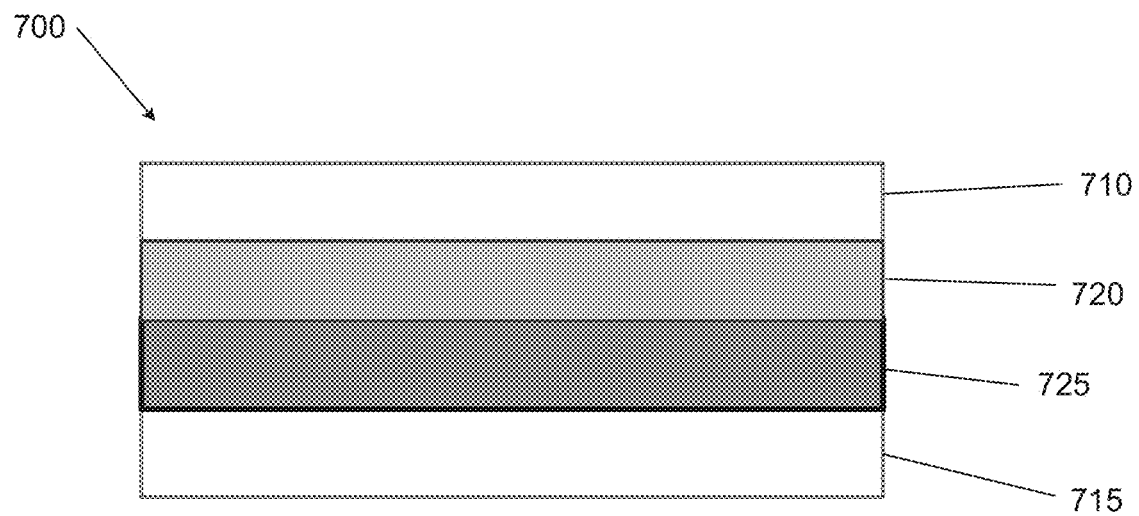
FIG. 7A illustrates a cross-section of an example memristive element.
Figure 7B:
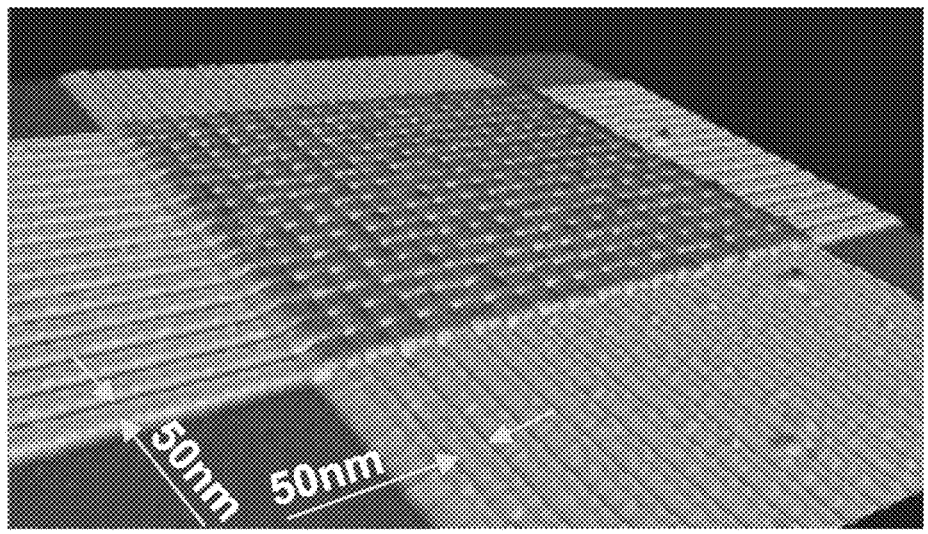
FIG. 7B shows an atomic force microscopy image of a crossbar array.

Example results from an example structure according to the principles herein are as follows. $TaO_x$ shows excellent electrical performance including high endurance, high speed and low energy. However, $TaO_x$ exhibits a linear current-voltage (I-V) relation in the low resistance state, which limits its application in ultra-high dense passive crossbar arrays without use of select devices (such as transistors). In FIG. 7A, the example memristive element 700 includes a layer 725 of $Ti_4O_7$ forming a hetero-junction with the layer 720 of $TaO_x$ between electrodes 710, 715. A nanodevice is produced as a multilayer structure made from arranging memristive elements with the layer structure shown in FIG. 7A in a crossbar array to provide a 50 nm×50 nm Pt/$TaO_x$/$Ti_4O_7$/Pt nanodevice. The nanodevice is fabricated by nanoimprint lithography with 50 nm half-pitch. FIG. 7B shows an atomic force microscopy image of the nanodevice. Current-voltage (I-V) measurements are made on the nanodevice. From isolating the function of each interface in the device stack, it is determined that the nonlinearity of the I-V characteristics arises from the hetero-junction of the $TaO_x$/$Ti_4O_7$ bi-layer and the switching occurs at the Pt/$TaO_x$ interface. It is possible that the interface (hetero-junction) between the two oxide layers is chemically altered from the original structure. As a result, some new phases of oxides may be formed at the $TaO_x$/$Ti_4O_7$ hetero-junction. Also, the $TaO_x$/$Ti_4O_7$ interface appears to exhibit negative differential resistance properties. Both micro-scale and nano-scale devices with the stack structure of Pt/$TaO_x$/$Ti_4O_7$/Pt show desirable nonlinearity.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memristive element comprising:
   a first electrode of a nanoscale width;
   a second electrode of a nanoscale width; and
   an active region disposed between and in electrical contact with the first and second electrodes, the active region having a switching layer of a first metal oxide and a conductive layer of a second metal oxide, wherein a metal on of the first metal oxide differs from a metal ion of the second metal oxide, wherein the first metal oxide and the second metal oxide are oxides of at least one of Al, Si, Ga, Ge, Sr, Ba, Sc, Ti, V, Cr, Mn, Fe, Co, Ni, Cu, Zn, Y, Zr, Nb, Mo, Ru, Rh, Pd, Ag, Cd, La, Hf, Ta, W, Re, Os, Ir, and Pt; and
   wherein the memristive element exhibits a nonlinear current-voltage characteristic in a low resistance state based on an oxide hetero-junction between the first metal oxide and the second metal oxide.

2. The memristive element of claim 1, wherein the switching layer is capable of carrying a species of dopants and transporting the dopants under an applied potential and the conductive layer is formed of a dopant source material that includes the species of dopants that are capable of drifting into the switching layer under the applied potential.

3. The memristive element of claim 1, wherein the first metal oxide is an oxide of tantalum, and wherein the second metal oxide is an oxide of titanium.

4. The memristive element of claim 3, wherein the oxide of tantalum is $TaO_x$, wherein $0<x\le2.5$, wherein the oxide of titanium is $Ti_nO_{2n-1}$, and wherein n=2, 3, 4, 5, ..., 20.

5. The memristive element of claim 1, wherein the first metal oxide is an oxide of tantalum, and wherein the second metal oxide is an oxide of tungsten.

6. The memristive element of claim 5, wherein the oxide of tantalum is $TaO_x$, wherein $0<x\le2.5$, and wherein the oxide of tungsten is $WO_{3-y}$, wherein $0\le y\le1$.

7. The memristive element of claim 1, wherein the first metal oxide is $TiO_2$, $TaO_x$, wherein $0<x\le2.5$, or NiO.

8. The memristive element of claim 1, wherein the second metal oxide is $IrO_2$, $MoO_2$, $OsO_2$, $RhO_2$, $Ti_2O_3$, $Ti_3O_5$, $RuO_2$, $Ti_4O_7$, $WO_z$, wherein $0<z\le3$, $SrTiO_{1-q}$, wherein $0<q\le0.2$, $HfO_x$, wherein $0<x<2$, or $SiO_x$, where $0<x<2$.

9. A multilayer structure comprising:
   a base;
   a multilayer circuit disposed above the base, wherein the multilayer circuit comprises at least two of the memristive elements of claim 1; and
   conductive lines leading from the base to the plurality of memristive elements, wherein each memristive element is disposed at an intersection of the conductive lines.

10. The multilayer structure of claim 9, wherein the multilayer structure is a dynamic random access memory, a resistance random access memory, a flash memory, a non-volatile memory, a read-only memory, or a static random access memory.

11. The multilayer structure of claim 9, further comprising:
   a via array comprising a set of first vias and a set of second vias; and
   at least two crossbar arrays configured to overlie the base, wherein the at least two crossbar arrays form at least two intersections, wherein a first of the memristive elements and a second of the memristive elements are positioned at different intersections, and
   wherein the conductive lines leading from the base to the first of the memristive elements and the second of the memristive elements comprise at least one first via, at least one second via, and at least two crossbar lines of the at least two crossbar arrays.

12. The multilayer structure of claim 11, wherein the multilayer structure is a dynamic random access memory, a resistance random access memory, a flash memory, a non-volatile memory, a read-only memory, or a static random access memory.

13. A memristive element comprising:
   a first electrode of a nanoscale width;
   a second electrode of a nanoscale width; and
   an active region disposed between and in electrical contact with the first and second electrodes, the active region having a switching layer of $TaO_x$, wherein $0<x\le2.5$, and a conductive layer of $Ti_nO_{2n-1}$, and wherein n=2, 3, 4, 5, ... 20;
   wherein the memristive element exhibits a nonlinear current-voltage characteristic in a low resistance state based on an oxide hetero-junction between the $TaO_x$ and the $Ti_nO_{2n-1}$.

14. A multilayer structure comprising:
   a base;
   a multilayer circuit disposed above the base, wherein the multilayer circuit comprises at least two of the memristive elements of claim 13; and
   conductive lines leading from the base to the plurality of memristive elements, wherein each memristive element is disposed at an intersection of the conductive lines.

15. The multilayer structure of claim 14, wherein the multilayer structure is a dynamic random access memory, a resistance random access memory, a flash memory, a non-volatile memory, a read-only memory, or a static random access memory.

16. The multilayer structure of claim 14, further comprising:
a via array comprising a set of first vias and a set of second vias; and
at least two crossbar arrays configured to overlie the base, wherein the at least two crossbar arrays form at least two intersections, wherein a first of the memristive elements and a second of the memristive elements are positioned at different intersections, and
wherein the conductive lines leading from the base to the first of the memristive elements and the second of the memristive elements comprise at least one first via, at least one second via, and at least two crossbar lines of the at least two crossbar arrays.

17. The multilayer structure of claim 16, wherein the multilayer structure is a dynamic random access memory, a resistance random access memory, a flash memory, a non-volatile memory, a read-only memory, or a static random access memory.

18. A memristive element comprising:
a first electrode of a nanoscale width;
a second electrode of a nanoscale width; and
an active region disposed between and in electrical contact with the first and second electrodes, the active region having a switching layer of $TaO_x$, wherein $0<x\leq2.5$, and a conductive layer of $WO_z$, wherein $0<z\leq3$;
wherein the memristive element exhibits a nonlinear current-voltage characteristic in a low resistance state based on an oxide hetero-junction between the $TaO_x$ and the $WO_z$.

19. A multilayer structure comprising:
a base;
a multilayer circuit disposed above the base, wherein the multilayer circuit comprises at least two of the memristive elements of claim 18; and
conductive lines leading from the base to the plurality of memristive elements, wherein each memristive element is disposed at an intersection of the conductive lines.

20. The multilayer structure of claim 19, wherein the multilayer structure is a dynamic random access memory, a flash memory, a non-volatile memory, a read-only memory, or a static random access memory.

21. The multilayer structure of claim 19, further comprising:
a via array comprising a set of first vias and a set of second vias; and
at least two crossbar arrays configured to overlie the base, wherein the at least two crossbar arrays form at least two intersections, wherein a first of the memristive elements and a second of the memristive elements are positioned at different intersections, and
wherein the conductive lines leading from the base to the first of the memristive elements and the second of the memristive elements comprise at least one first via, at least one second via, and at least two crossbar lines of the at least two crossbar arrays.

22. The multilayer structure of claim 21, wherein the multilayer structure is a dynamic random access memory, a resistance random access memory, a flash memory, a non-volatile memory, a read-only memory, or a static random access memory.

* * * * *